US012804835B2

(12) United States Patent
Jeong et al.

(10) Patent No.: US 12,804,835 B2
(45) Date of Patent: Nov. 17, 2026

(54) DISPLAY APPARATUS

(71) Applicant: LG DISPLAY CO., LTD., Seoul (KR)

(72) Inventors: Haeyong Jeong, Paju-si (KR); Dongnyuck Park, Seoul (KR)

(73) Assignee: LG Display Co., Ltd., Seoul (KR)

( * ) Notice: Subject to any disclaimer, the term of this patent is extended or adjusted under 35 U.S.C. 154(b) by 87 days.

(21) Appl. No.: 19/053,749

(22) Filed: Feb. 14, 2025

(65) Prior Publication Data

US 2025/0267813 A1 Aug. 21, 2025

(30) Foreign Application Priority Data

Feb. 21, 2024 (KR) ........................ 10-2024-0024759

(51) Int. Cl.
*H05K 5/03* (2006.01)

(52) U.S. Cl.
CPC ..................................... *H05K 5/03* (2013.01)

(58) Field of Classification Search
CPC ........................................................ H05K 5/00
See application file for complete search history.

(56) References Cited

U.S. PATENT DOCUMENTS

2023/0229199 A1* 7/2023 Lee ....................... G06F 1/1656
361/679.27
2026/0118913 A1* 4/2026 Seo ....................... G06F 1/1652

FOREIGN PATENT DOCUMENTS

KR 10-2022-0026271 A 3/2022

* cited by examiner

*Primary Examiner* — Jerry Wu
(74) *Attorney, Agent, or Firm* — Morgan, Lewis & Bockius LLP

(57) ABSTRACT

A display apparatus may include a display panel, a display area, a non-display area, a cover member disposed on the display panel and having a bezel area, a back plate disposed under the display panel, and a middle frame that covers and supports a portion of the bezel area of the cover member and a portion of the back plate.

7 Claims, 8 Drawing Sheets

DISPLAY APPARATUS

CROSS REFERENCE TO RELATED APPLICATION

The present application claims the benefit of and priority to Korean Patent Application No. 10-2024-0024759, filed Feb. 21, 2024, the entire contents of which are incorporated herein by this reference for all purposes.

BACKGROUND

1. Technical Field

The present specification relates to a display apparatus, and particularly to, for example, without limitation, a display apparatus in which rigidity can be reinforced and an external impact can be mitigated.

2. Description of the Related Art

Display apparatuses generally include a display area in which images are displayed and a bezel area formed along an outer edge portion of the display area. When the bezel area is thin, a user's gaze may be focused on a screen of the display area, thereby increasing the user's immersion.

In the case of a flexible display apparatus, a portion of a flexible display panel is folded back to reduce the bezel area so that a flexible circuit board, etc. is disposed on a back surface of the display panel.

The description of the related art should not be assumed to be prior art merely because it is mentioned in or associated with this section. The description of the related art includes information that describes one or more aspects of the subject technology, and the description in this section does not limit the invention.

SUMMARY

A back protection film is sometimes used to protect a back surface of a flexible display panel on which a flexible circuit board, etc., is disposed.

However, since the back protection film is thin and has low rigidity, defects such as the back protection film being folded, lifted, or stabbed occur, and thus there is a limitation to protecting the back surface of the display panel.

Therefore, the inventors of the present specification have developed a novel structure that can protect a back surface of a flexible display panel having higher rigidity without easy deformation.

Embodiments of the present specification are directed to providing a display apparatus in which a back surface of a display panel can be protected, rigidity can be reinforced, and an impact can be mitigated.

The aspects of the present specification are not limited to the above-described aspects, and other aspects that are not mentioned will be able to be clearly understood by those skilled in the art from the following description.

A display apparatus according to embodiments of the present specification includes a display panel, a display area, a non-display area, a cover member disposed on the display panel and having a bezel area, a back plate disposed under the display panel, and a middle frame that covers and supports a portion of the bezel area of the cover member and a portion of the back plate.

Detailed matters of other embodiments are included in a detailed description and accompanying drawings.

Additional features, advantages, and aspects of the present disclosure are set forth in part in the description that follows and in part will become apparent from the present disclosure or may be learned by practice of the inventive concepts provided herein. Other features, advantages, and aspects of the present disclosure may be realized and attained by the descriptions provided in the present disclosure, or derivable therefrom, and the claims hereof as well as the drawings. It is intended that all such features, advantages, and aspects be included within this description, be within the scope of the present disclosure, and be protected by the following claims. Nothing in this section should be taken as a limitation on those claims. Further aspects and advantages are discussed below in conjunction with embodiments of the present disclosure.

It is to be understood that both the foregoing description and the following description of the present disclosure are examples, and are intended to provide further explanation of the disclosure as claimed.

BRIEF DESCRIPTION OF THE DRAWINGS

The accompanying drawings, which are included to provide a further understanding of the present disclosure, are incorporated in and constitute a part of this present disclosure, illustrate aspects and embodiments of the present disclosure, and together with the description serve to explain principles and examples of the disclosure.

Figure 1:
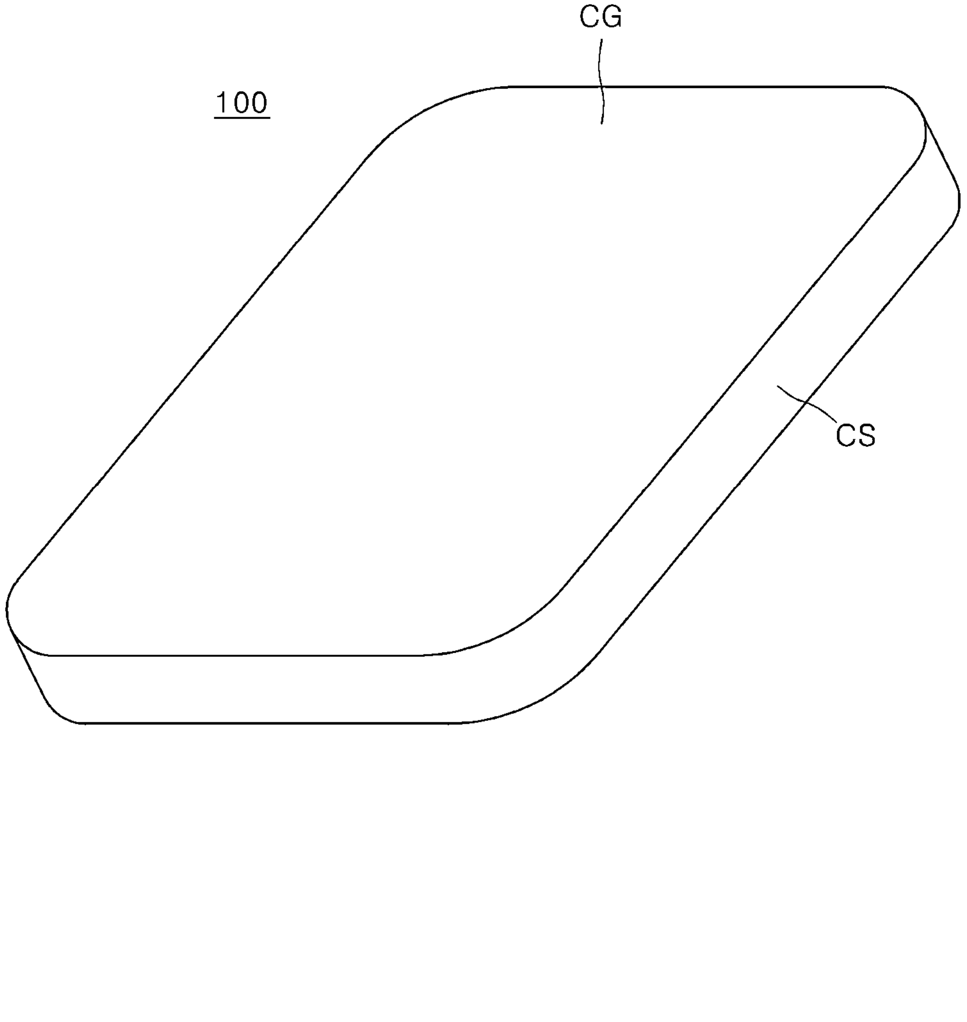
FIG. 1 is a schematic front perspective view showing a display apparatus according to one embodiment of the present specification.

Throughout the drawings and the detailed description, unless otherwise described, the same drawing reference numerals should be understood to refer to the same elements, features, and structures. The sizes, lengths, and thicknesses of layers, regions and elements, and depiction thereof may be exaggerated for clarity, illustration, and/or convenience.

DETAILED DESCRIPTION

Advantages and features of the present specification and methods for achieving them will become clear with reference to embodiments described below in detail in conjunction with the accompanying drawings. However, the present specification is not limited to the embodiments disclosed below but will be implemented in various different forms, these embodiments are merely provided to make the disclosure of the present specification complete and fully inform those skilled in the art to which the present specification pertains of the scope of the present specification.

Since shapes, sizes, ratios, angles, numbers, and the like disclosed in the drawings for describing the embodiments of the present specification are illustrative, the present specification is not limited to the illustrated items. The same reference number denotes the same components throughout the specification. In addition, in describing the present specification, when it is determined that the detailed description of a related known technology may unnecessarily obscure the gist of the present specification, detailed description thereof will be omitted. When terms "comprises," "has," "consists of," and the like described in the present specification are used, other parts may be added unless "only" is used. When a component is expressed in the singular, it includes a case in which the component is provided as a plurality of components unless specifically stated otherwise.

In construing a component, the component is construed as including the margin of error even when there is no separate explicit description.

When the positional relationship is described, for example, when the positional relationship between two parts is described using the term "on," "above," "under," "next to," or the like, one or more other parts may be positioned between the two parts unless the term "immediately" or "directly" is used.

Although terms such as first and second are used to describe various components, the components are not limited by the terms. The terms are only used to distinguish one component from another. Therefore, a first component described below may be a second component within the technical spirit of the present specification.

The same reference number denotes the same components throughout the specification.

The size and thickness of each component shown in the drawings are shown for convenience of description, and the present specification is not necessarily limited to the sizes and thicknesses of the components shown.

Features of various embodiments of the present specification can be partially or fully coupled or combined, and as can be fully understood by those skilled in the art, various technical interconnection and operations are possible, and the embodiments may be implemented independently of each other and implemented together in combination thereof.

Hereinafter, a display apparatus according to an embodiment of the present disclosure will be described in detail with reference to the accompanying drawings.

FIG. 1 is a schematic front perspective view showing a display apparatus according to one embodiment of the present specification.

Referring to FIG. 1, a display apparatus 100 according to one embodiment of the present specification includes a cover member CG and a bottom cover CS supporting the cover member CG.

The cover member CG may include a display area and a bezel area, and a display panel may be disposed under the cover member CG. Additional components disposed under the cover member CG will be described with reference to FIGS. 2 to 4.

The cover member CG may be disposed on the display panel to cover a front surface of the display panel and may protect the display panel from an external impact. The cover member CG may be made of a transparent plastic material or a transparent glass material to display an image of the display panel, but is not limited thereto.

The bottom cover CS may accommodate a display panel, a circuit board for driving the display panel, etc. The bottom cover CS may, for example, accommodate various components such as a camera module, a speaker, a facial recognition sensor, and a battery.

Figure 2:
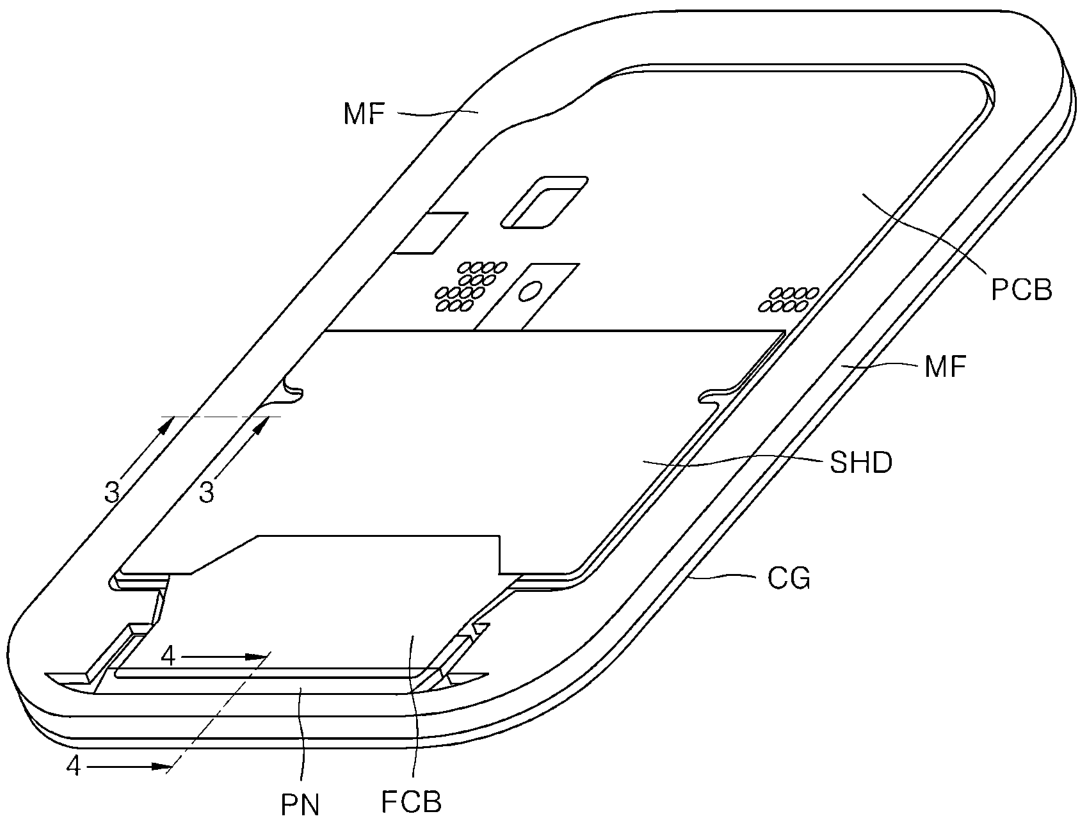
FIG. 2 is a schematic back view showing some components of the display apparatus according to one embodiment of the present specification.

FIG. 2 is a schematic back view showing some components of the display apparatus 100 according to one embodiment of the present specification.

Referring to FIG. 2, the display apparatus 100 according to one embodiment of the present specification may include the cover member CG, a display panel PN, a flexible circuit board FCB, a shielding member SHD, a printed circuit board PCB, and a middle frame MF.

The display panel PN may be disposed on a back surface of the cover member CG. To implement a narrow bezel area, the flexible circuit board FCB connected to the display panel PN may be positioned on a back surface of the display panel PN. The display panel PN is a flexible display panel, and a portion of a substrate on which a pad part is formed may be bent toward the back surface of the display panel PN. The flexible circuit board FCB may be connected to the pad part of the display panel PN. The flexible circuit board FCB may have a plurality of lines disposed to drive the display panel and at least one driving chip mounted thereon.

The shielding member SHD may be disposed on the back surface of the display panel PN to cover a portion of a printed circuit board PCB connected to the flexible circuit board FCB.

The middle frame MF may be disposed along edge areas of the cover member CG and the display panel PN to protect the back surface of the display panel PN that is not covered by the flexible circuit board FCB, the printed circuit board PCB, etc.

The middle frame MF may be formed by injecting a resin into a mold manufactured in advance in a desired shape and then curing the same. The middle frame MF may be made of an ultraviolet (UV) curable or heat-curable resin. The middle frame MF may be made of, for example, an acrylic resin, an epoxy resin, or a polyurethane resin that may be cured by ultraviolet or heat, but is not limited thereto.

Figure 3:
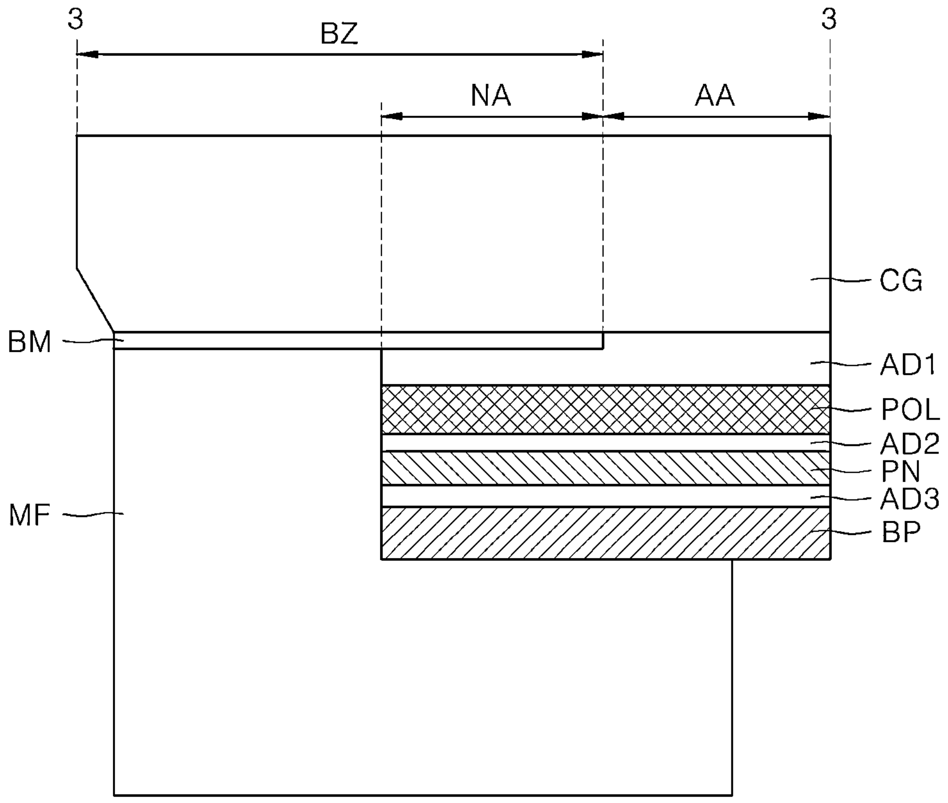
FIG. 3 is a cross-sectional view along line 3-3 in FIG. 2.

FIG. 3 is a cross-sectional view along line 3-3 in FIG. 2.

Referring to FIGS. 2 and 3, the display apparatus 100 according to one embodiment of the present specification may include the display panel PN including a display area AA on which an image is displayed and a non-display area NA, the cover member CG disposed on the display panel PN, a polarizing member POL disposed between the display panel PN and the cover member CG, a backplate BP disposed under the display panel PN, and the middle frame MF disposed under a bezel area BZ of the cover member CG.

The display panel PN may include the display area AA on which an image is displayed and the non-display area NA which is an area other than the display area AA. The non-display area NA may be an edge area surrounding the display area AA. The display area of the cover member CG may be the same or substantially same area as the display area AA of the display panel PN. The bezel area BZ of the cover member CG may be an area including the non-display area NA of the display panel PN.

A plurality of pixels for displaying an image may be disposed in the display area AA of the display panel PN, and at least one driving unit for driving the plurality of pixels may be disposed in the non-display area NA of the display panel PN.

Each pixel may include a plurality of sub-pixels, and each sub-pixel may include a light emitting element and a pixel driving circuit for driving the light emitting element. The pixel driving circuit may include at least one transistor and at least one capacitor. The light emitting element may emit light of one of red, green, blue, and white.

The middle frame MF may support the bezel area BZ of the cover member CG and surround side surfaces of the polarizing member POL, side surfaces of the display panel PN, and side surfaces of the back plate BP. The middle frame MF may cover a portion of the back plate BP.

The middle frame MF can prevent or reduce foreign substances, moisture, etc. from penetrating into the display panel PN and protect the display panel PN from an external impact.

The middle frame MF may be accommodated in the bottom cover CS, and the middle frame MF may be in close contact with the side surfaces of the bottom cover CS. Since the shape of the middle frame MF is designed to correspond to the shape of the bottom cover CS, the cover member CG and the bottom cover CS may be easily assembled.

The polarizing member POL is a circular polarizing plate for blocking external light and may include a protection film and a phase difference layer and a linear polarizing layer that are attached to an outer surface of the protection film.

The back plate BP may have a predetermined strength and thickness to supplement the rigidity of the display panel PN. The back plate BP may be made of plastic. For example, the back plate BP may be made of polyethylene terephthalate (PET), polyimide (PI), polyethylene naphthalate (PEN), etc., but is not limited thereto.

A first adhesive layer AD1 may be disposed between the cover member CG and the polarizing member POL, and a second adhesive layer AD2 may be disposed between the polarizing member POL and the display panel PN. A third adhesive layer AD3 may be disposed between the display panel PN and the back plate BP. The first to third adhesive layers AD1, AD2, and AD3 may be made of a material such as an optical clear adhesive (OCA), an optical clear resin (OCR), or a pressure sensitive adhesive (PSA), but are not limited thereto.

In one embodiment, a support plate may be disposed under the back plate BP to further supplement the rigidity of the display panel PN. The support plate may be made of a metal material. For example, the support plate may be made of stainless steel. In this case, the middle frame MF may cover a portion of a lower surface of the support plate instead of a portion of a lower surface of the back plate BP. In this case, a fourth adhesive layer may be disposed between the back plate BP and the support plate.

The display apparatus 100 may further include a light shielding pattern BM disposed in the bezel area BZ of the cover member CG. The light shielding pattern BM may be disposed on a lower surface of the cover member CG to block various circuits and lines and various structures disposed in the non-display area NA of the display panel PN from being viewed by a user. The light shielding pattern BM may be made of a material capable of absorbing light.

The middle frame MF may be in contact with the light shielding pattern BM disposed in the bezel area BZ of the cover member CG.

The cross-sectional structure shown in FIG. 3 may be applied to three side portions, upper side portion, left side portion, and right side portion in the same or substantially same manner other than a lower side portion of the display apparatus 100 in which a bending area shown in FIG. 4 below is formed among four side portions of the display apparatus 100.

Figure 4:
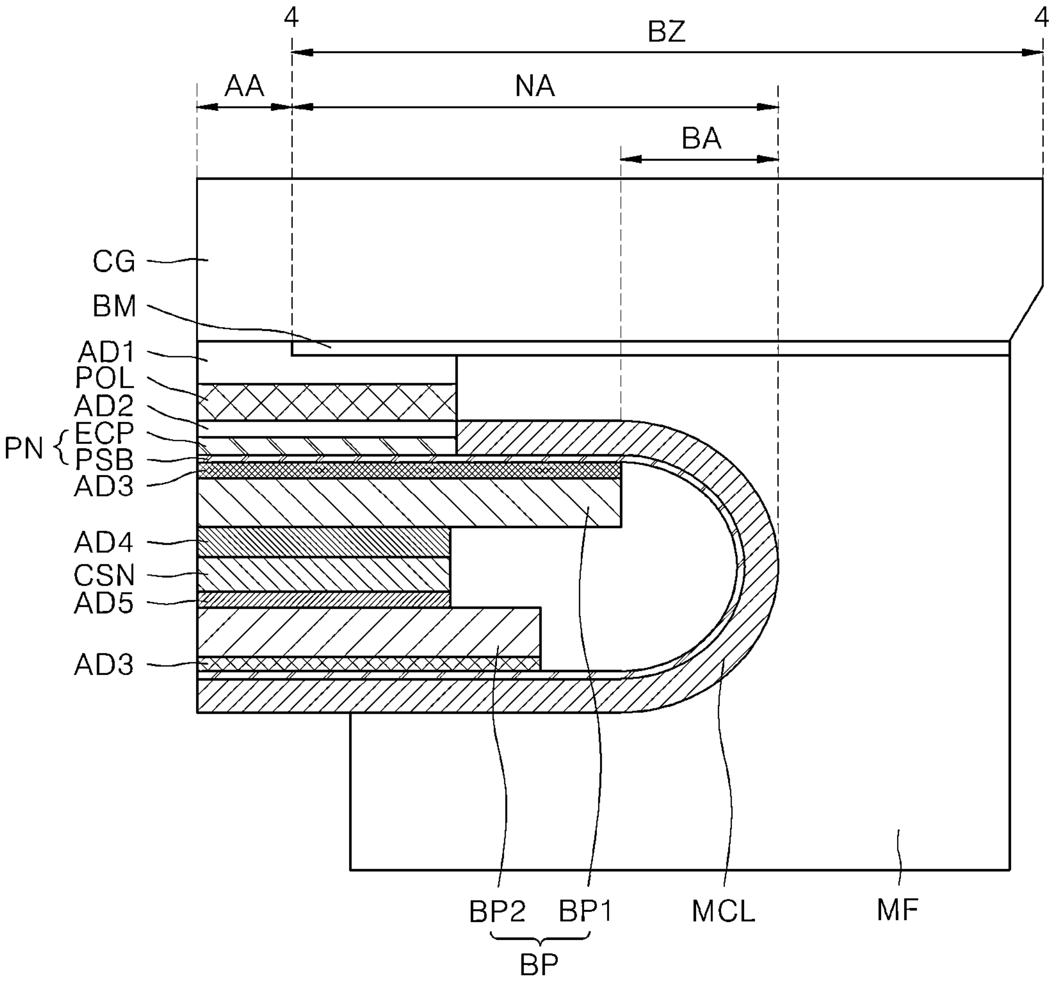
FIG. 4 is a cross-sectional view along line 4-4 in FIG. 2.

FIG. 4 is a cross-sectional view along line 4-4 in FIG. 2. FIG. 4 shows a cross-sectional view cut along the lower side portion of the display apparatus 100.

Referring to FIGS. 2 and 4, the display apparatus 100 according to one embodiment of the present specification may include the display panel PN including the display area AA on which an image is displayed and the non-display area NA having a bending area BA, the cover member CG disposed on the display panel PN, the polarizing member POL disposed between the display panel PN and the cover member CG, the backplate BP disposed under the display panel PN, and the middle frame MF disposed under the bezel area BZ of the cover member CG.

The non-display area NA of the display panel PN may include the bending area BA in which a portion of the display panel PN is bent. A portion of the non-display area NA of the display panel PN may be disposed under the display area AA of the display panel PN by the bending area BA. The flexible circuit board FCB may be connected to the pad part formed at the end of the non-display area NA disposed under the display area AA of the display panel PN.

The display panel PN may include an array substrate PSB on which pixels are formed and an encapsulation part ECP. The encapsulation part ECP may not be disposed in the bending area BA of the display panel PN.

The array substrate PSB may have a flexible characteristic. The encapsulation part ECP may be disposed on the array substrate PSB to cover the pixels. The encapsulation part ECP can prevent or reduce oxygen or moisture from penetrating the pixels. The encapsulation part ECP may be formed as a multilayered structure in which organic material layers and inorganic material layers are alternately stacked, but is not limited thereto.

A coating layer MCL is disposed on the bending area BA of the display panel PN. The coating layer MCL may be disposed in the non-display area NA of the display panel PN to be in contact with the encapsulation part ECP. The coating layer MCL may be disposed to extend to the pad part of the non-display area NA of the display panel PN to which the flexible circuit board FCB is connected.

The coating layer MCL may cover various signal lines disposed between the encapsulation part ECP of the display panel PN and the flexible circuit board FCB, thereby protecting the signal lines from an external impact and preventing or reducing moisture from penetrating the signal lines. The coating layer 158 may reinforce the rigidity of the bending area BA of the display panel PN. The coating layer MCL may be referred to as a micro coating layer.

The back plate BP may include a first back plate BP1 disposed to support the display area AA of the display panel PN and overlap the display area AA and a second back plate BP2 disposed to support the non-display area NA of the display panel PN and overlap the first back plate BP1.

The first back plate BP1 and the second back plate BP2 are disposed in the form of being spaced apart or separated by a predetermined interval to secure the flexibility of the bending area BA of the display panel PN. The back plate is not disposed in the bending area BA of the display panel PN.

A cushion layer CSN may be disposed between the first back plate BP1 and the second back plate BP2, the first back plate BP1 and the cushion layer CSN may be adhered by the fourth adhesive layer AD4, and the second back plate BP2 and the cushion layer CSN may be adhered by a fifth adhesive layer AD5.

The first back plate BP1 may protrude further than the second back plate BP2 toward the bending area BA.

The middle frame MF may support the bezel area BZ of the cover member CG and surround the bending area BA of the display panel PN. The middle frame MF may surround the coating layer MCL disposed in the bending area BA. The middle frame MF may be in contact with the coating layer MCL.

The middle frame MF can prevent or reduce foreign substances, moisture, etc. from penetrating into the display panel PN and protect the display panel PN from an external impact.

The middle frame MF may be accommodated in the bottom cover CS, and the middle frame MF may be in close contact with the side surfaces of the bottom cover CS. Since the shape of the middle frame MF is designed to correspond to the shape of the bottom cover CS, the cover member CG and the bottom cover CS may be easily assembled.

The middle frame MF may be in contact with the light shielding pattern BM disposed in the bezel area BZ of the cover member CG.

Figure 5:
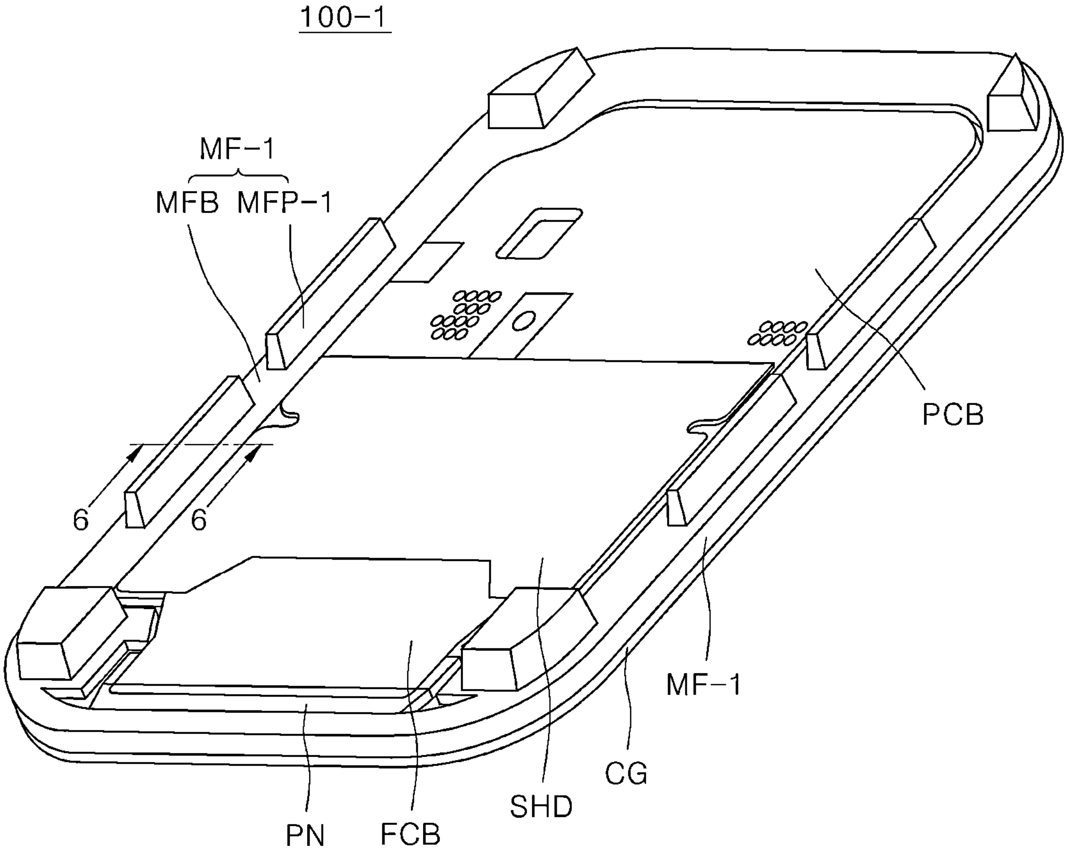
FIG. 5 is a schematic back perspective view showing some components of the display apparatus according to one embodiment of the present specification.
Figure 6:
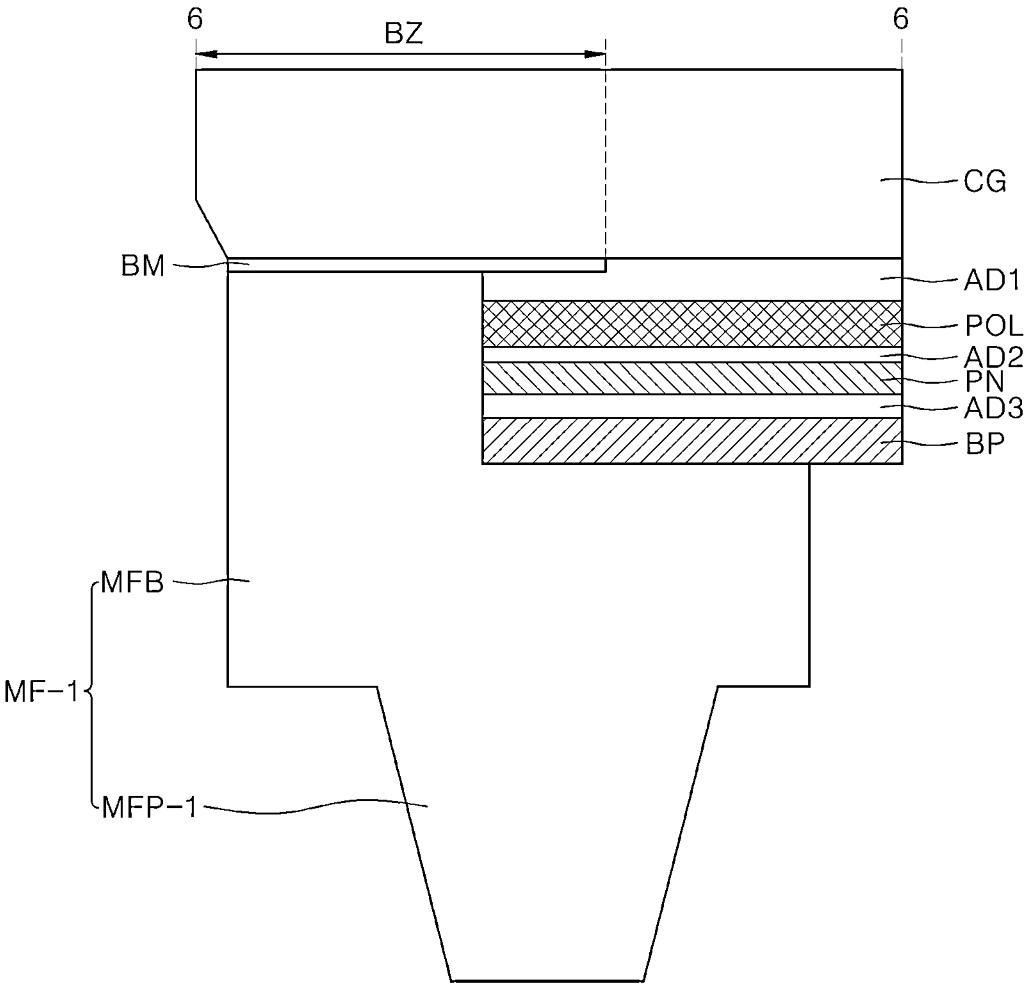
FIG. 6 is a cross-sectional view along line 6-6 in FIG. 5.

FIG. 5 is a schematic back perspective view showing some components of a display apparatus 100-1 according to one embodiment of the present specification. FIG. 6 is a cross-sectional view along line 6-6 in FIG. 5.

Referring to FIGS. 5 and 6, the display apparatus 100-1 according to one embodiment of the present specification may include a middle frame MF-1 disposed along the edge areas of the cover member CG and the display panel PN to protect the back surface of the display panel PN that is not covered by the flexible circuit board FCB, the shielding member SHD, etc.

The middle frame MF-1 may include a base member MFB that covers and supports a portion of the bezel area BZ of the cover member CG and a portion of the back plate BP and a protruding structure MFP-1 protruding from the base member MFB.

The protruding structure MFP-1 may include a plurality of protruding members spaced apart from each other along the base member MFB in a perimetric direction of the base member MFB. The perimetric direction of the base member MFB may be a direction that rotates clockwise or counter-clockwise along the perimeter of the base member MFB.

The middle frame MF-1 may be formed by injecting a resin into a mold manufactured in advance in a desired shape and then curing the same. The middle frame MF-1 may be made of an ultraviolet (UV) curable or heat-curable resin. The middle frame MF-1 may be made of, for example, an acrylic resin, an epoxy resin, or a polyurethane resin that may be cured by ultraviolet or heat, but is not limited thereto.

The middle frame MF-1 may support the bezel area BZ of the cover member CG and surround side surfaces of the polarizing member POL, side surfaces of the display panel PN, and side surfaces of the back plate BP. The middle frame MF-1 may cover a portion of the back plate BP.

The middle frame MF-1 can prevent or reduce foreign substances, moisture, etc. from penetrating the display panel PN and protect the display panel PN from an external impact.

The middle frame MF-1 may be accommodated in the bottom cover CS, and the middle frame MF-1 may be in close contact with the side surfaces of the bottom cover CS. Since the shape of the middle frame MF-1 is designed to correspond to the shape of the bottom cover CS, the cover member CG and the bottom cover CS may be easily assembled.

The protruding structure MFP-1 of the middle frame MF-1 may be, for example, in contact with the bottom surface of the bottom cover CS. The protruding structure MFP-1 of the middle frame MF-1 may be, for example, in contact with a component accommodated in the bottom cover CS. Therefore, the middle frame MF-1 may reinforce the rigidity of the display apparatus 100-1 and mitigate an external impact applied to the display apparatus 100-1.

Figure 7:
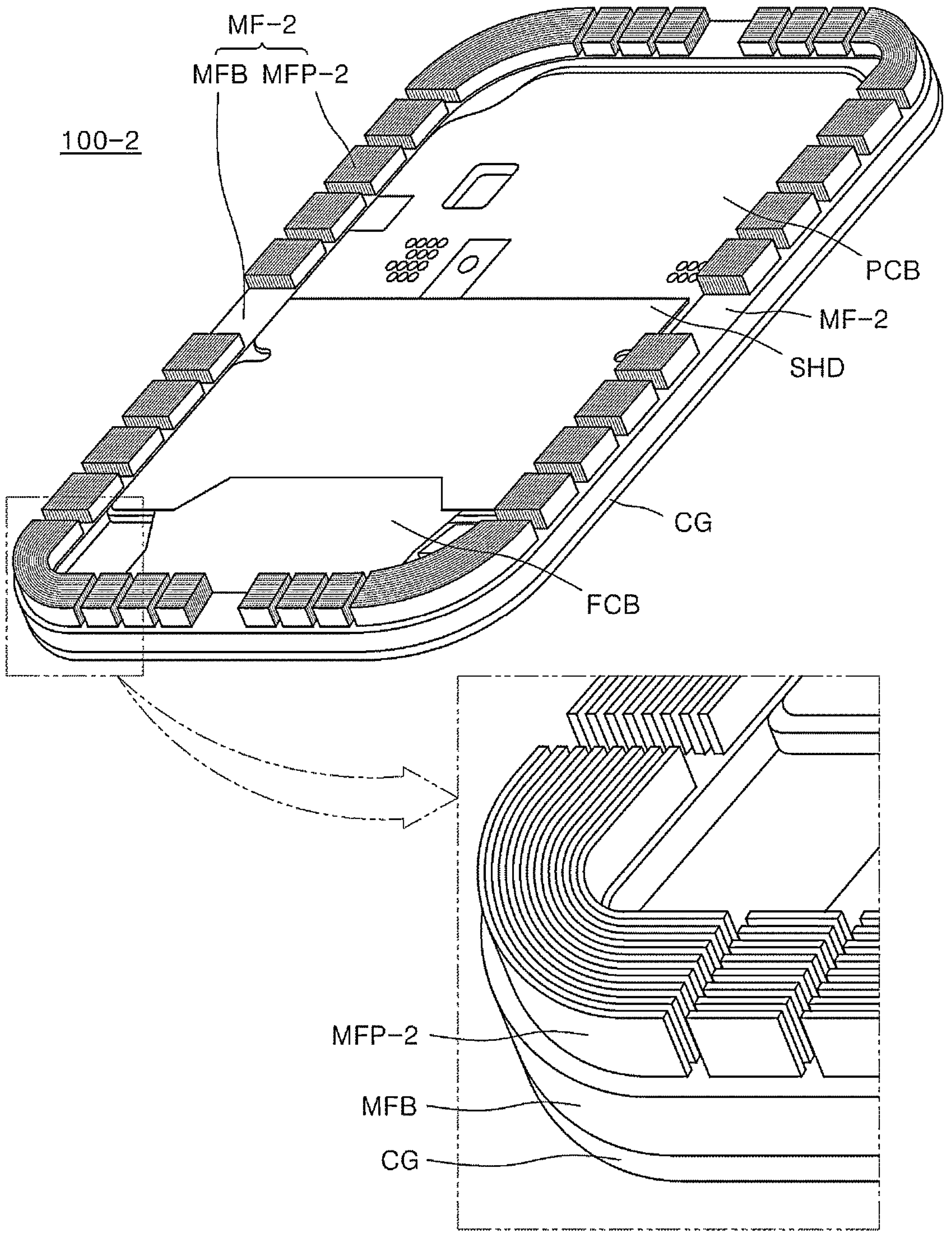
FIG. 7 is a schematic back perspective view showing some components of the display apparatus according to one embodiment of the present specification.

FIG. 7 is a schematic back perspective view showing some components of a display apparatus 100-2 according to one embodiment of the present specification.

Referring to FIGS. 7, the display apparatus 100-2 according to one embodiment of the present specification may include the cover member CG and a middle frame MF-2 disposed along the edge area of the display panel PN to protect the back surface of the display panel PN that is not covered by the flexible circuit board FCB, the shielding member SHD, etc.

The middle frame MF-2 may include a base member MFB that covers and supports a portion of the bezel area BZ of the cover member CG and a portion of the back plate BP and a protruding structure MFP-2 protruding from the base member MFB.

The protruding structure MFP-2 may include a plurality of protruding members spaced apart along the base member MFB in a perimetric direction of the base member MFB. Each of the plurality of protruding members may include a plurality of protruding patterns spaced apart from each other in a direction perpendicular to the perimetric direction of the base member MFB.

The middle frame MF-2 may be formed by injecting a resin into a mold manufactured in advance in a desired shape and then curing the same. The middle frame MF-2 may be made of an ultraviolet (UV) curable or heat-curable resin. The middle frame MF-2 may be made of, for example, an acrylic resin, an epoxy resin, or a polyurethane resin that may be cured by ultraviolet or heat, but is not limited thereto.

The middle frame MF-2 may support the bezel area BZ of the cover member CG and surround side surfaces of the polarizing member POL, side surfaces of the display panel PN, and side surfaces of the back plate BP. The middle frame MF-2 may cover a portion of the back plate BP.

The middle frame MF-2 can prevent or reduce foreign substances, moisture, etc. from penetrating the display panel PN and protect the display panel PN from an external impact.

The middle frame MF-2 may be accommodated in the bottom cover CS, and the middle frame MF-2 may be in close contact with the side surfaces of the bottom cover CS. Since the shape of the middle frame MF-2 is designed to correspond to the shape of the bottom cover CS, the cover member CG and the bottom cover CS may be easily assembled.

The protruding structure MFP-2 of the middle frame MF-2 may be, for example, in contact with the bottom surface of the bottom cover CS or in contact with a component accommodated in the bottom cover CS. Therefore, the middle frame MF-2 may reinforce the rigidity of the display apparatus 100-2 and mitigate an external impact applied to the display apparatus 100-2.

Figure 8:
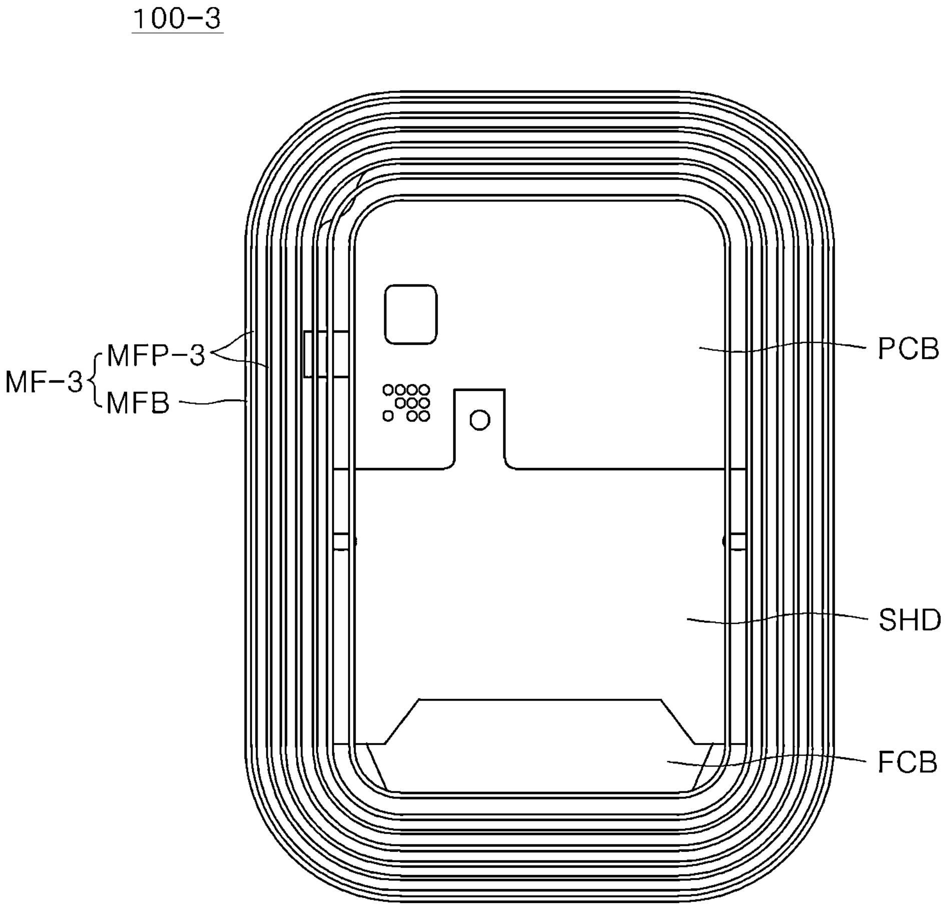
FIG. 8 is a schematic back view showing some components of the display apparatus according to one embodiment of the present specification.

FIG. 8 is a schematic back view showing some components of a display apparatus 100-3 according to one embodiment of the present specification.

The display apparatus 100-3 according to one embodiment of the present specification may include the cover member CG and a middle frame MF-3 disposed along the edge area of the display panel PN to protect the back surface of the display panel PN that is not covered by the flexible circuit board FCB, the shielding member SHD, etc.

The middle frame MF-3 may include a base member MFB that covers and supports a portion of the bezel area BZ of the cover member CG and a portion of the back plate BP and a protruding structure MFP-3 protruding from the base member MFB.

The protruding structure MFP-3 may include a plurality of ring patterns disposed on a back surface of the base member MFB. The plurality of ring patterns may be spaced apart from each other in a direction perpendicular to the perimetric direction of the base member MFB. In one embodiment, each of the plurality of ring patterns may have a wave shape.

The middle frame MF-3 may be formed by injecting a resin into a mold manufactured in advance in a desired shape and then curing the same. The middle frame MF-3 may be made of an ultraviolet (UV) curable or heat-curable resin. The middle frame MF-3 may be made of, for example, an acrylic resin, an epoxy resin, or a polyurethane resin that may be cured by ultraviolet or heat, but is not limited thereto.

The middle frame MF-3 may support the bezel area BZ of the cover member CG and surround side surfaces of the polarizing member POL, side surfaces of the display panel PN, and side surfaces of the back plate BP. The middle frame MF-3 may cover a portion of the back plate BP.

The middle frame MF-3 can prevent or reduce foreign substances, moisture, etc. from penetrating the display panel PN and protect the display panel PN from an external impact.

The middle frame MF-3 may be accommodated in the bottom cover CS, and the middle frame MF-3 may be in close contact with the side surfaces of the bottom cover CS. Since the shape of the middle frame MF-3 is designed to correspond to the shape of the bottom cover CS, the cover member CG and the bottom cover CS may be easily assembled.

The protruding structure MFP-3 of the middle frame MF-3 may be, for example, in contact with the bottom surface of the bottom cover CS or in contact with a component accommodated in the bottom cover CS. Therefore, the middle frame MF-3 may reinforce the rigidity of the display apparatus 100-3 and mitigate an external impact applied to the display apparatus 100-3.

The display apparatus according to the embodiments of the present specification may be described as follows.

A display apparatus according to embodiments of the present specification includes a display panel including a display area and a non-display area, a cover member disposed on the display panel and having a bezel area, a back plate disposed under the display panel, and a middle frame that covers and supports a portion of the bezel area of the cover member and a portion of the back plate.

According to one embodiment of the present specification, the middle frame may be made of an ultraviolet (UV) curable or heat-curable resin.

According to one embodiment of the present specification, the middle frame may include a base member that covers and supports a portion of the bezel area of the cover member and a portion of the back plate and a protruding structure protruding from the base member.

According to one embodiment of the present specification, the protruding structure may include a plurality of protruding members spaced apart from each other along the base member in a perimetric direction of the base member.

According to one embodiment of the present specification, each of the plurality of protruding members may have a different planar shape depending on positions at which the plurality of protruding members are disposed.

According to one embodiment of the present specification, each of the plurality of protruding members may include a plurality of protruding patterns spaced apart from each other in a direction perpendicular to the perimetric direction of the base member.

According to one embodiment of the present specification, the protruding structure may include a plurality of ring patterns disposed on a back surface of the base member.

According to one embodiment of the present specification, each of the plurality of ring patterns may have a wave shape.

According to one embodiment of the present specification, the display apparatus may further include a bottom cover that accommodates the display panel and supports the cover member, the middle frame may be accommodated in the bottom cover, and the middle frame may be in close contact with the bottom cover.

According to one embodiment of the present specification, the display apparatus may further include a light shielding pattern disposed in the bezel area of the cover member, and the middle frame may be in contact with the light shielding pattern.

According to one embodiment of the present specification, the display apparatus may further include a coating layer disposed in the bending area of the display panel, and the middle frame may be in contact with the coating layer.

According to the embodiments of the present specification, the back surface of the display panel can be protected, the rigidity of the display apparatus can be reinforced, and an external impact applied to the display apparatus can be mitigated.

According to the embodiments of the present specification, the penetration of foreign substances, moisture, etc. into the display panel can be prevented or reduced, and the display panel can be protected from the external impact.

According to the embodiments of the present specification, the cover member and the bottom cover can be easily assembled.

In addition, according to the embodiments of the present specification, the defect rate of the display panel can be reduced, thereby reducing production energy and greenhouse gases for producing the display apparatus.

The effects of the present specification are not limited to the above-described effects, and other effects that are not mentioned will be able to be clearly understood by those skilled in the art from the following description.

Although the embodiments of the present specification have been described in detail with reference to the accompanying drawings, the present specification is not necessarily limited to these embodiments, and various modifications may be carried out without departing from the technical spirit of the present specification. Therefore, the embodiments disclosed herein are not intended to limit the technical spirit or scope of the present disclosure, but for illustrative purposes, and the scope of the present disclosure is not limited by these embodiments. It will be understood by those of ordinary skill in the art that various modifications and variations in form and details may be made without departing from the spirit and scope of the present disclosure. Thus, the scope of the present disclosure is not limited to the embodiments shown, but is to be accorded the widest scope consistent with the claims. The scope of protection of the present disclosure should be construed based on the following claims, and all technical features within the scope of equivalents thereof should be construed as being included within the scope of the present disclosure.

What is claimed is:

1. A display apparatus, comprising:
a display panel;
a display area;
a non-display area;
a cover member disposed on top of the display panel and having a bezel area;
a back plate disposed under the display panel; and
a middle frame that covers and supports a portion of the bezel area of the cover member and a portion of the back plate,
wherein:
the middle frame includes: a base member that covers and supports the portion of the bezel area of the cover member and the portion of the back plate; and a protruding structure protruding from the base member;
the protruding structure includes a plurality of protruding members spaced apart from each other and surrounds the base member in a perimetric direction of the base member;
each of the plurality of protruding members has a different planar shape depending on a disposed position;
each of the plurality of protruding members includes a plurality of protruding patterns spaced apart from each other in a direction perpendicular to the perimetric direction of the base member; and
the plurality of protruding patterns are in contact with a bottom surface of a bottom cover and reinforce the rigidity of the display panel when a portion of the display panel is folded back to reduce the bezel area.

2. The display apparatus of claim 1, wherein the middle frame is made of an ultraviolet (UV) curable or heat-curable resin.

3. The display apparatus of claim 1, wherein the protruding structure includes a plurality of ring patterns disposed on a back surface of the base member.

4. The display apparatus of claim 3, wherein each of the plurality of ring patterns has a wave shape.

5. The display apparatus of claim 1, further comprising the bottom cover that accommodates the display panel and supports the cover member,
wherein the middle frame is accommodated in the bottom cover, and the middle frame is in close contact with the bottom cover.

6. The display apparatus of claim 1, further comprising a light shielding pattern disposed in the bezel area of the cover member,
wherein the middle frame is in contact with the light shielding pattern.

7. The display apparatus of claim 1, further comprising a coating layer disposed in a bending area of the display panel,
wherein the middle frame is in contact with the coating layer.

* * * * *